United States Patent
Wu et al.

(10) Patent No.: US 10,048,582 B2
(45) Date of Patent: Aug. 14, 2018

(54) PHOTO-IMPRINTING RESIN COMPOSITION, PHOTO-IMPRINTING RESIN FILM AND PATTERNING PROCESS

(71) Applicant: Industrial Technology Research Institute, Hsinchu (TW)

(72) Inventors: Yaw-Ting Wu, Zhubei (TW); Ping-Chen Chen, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 19 days.

(21) Appl. No.: 15/085,569

(22) Filed: Mar. 30, 2016

(65) Prior Publication Data

US 2017/0176852 A1    Jun. 22, 2017

(30) Foreign Application Priority Data

Dec. 16, 2015    (TW) .............................. 104142230 A

(51) Int. Cl.
| | | |
|---|---|---|
| *G03F 7/00* | (2006.01) | |
| *C09D 133/14* | (2006.01) | |
| *C09D 133/16* | (2006.01) | |
| *C08L 63/04* | (2006.01) | |

(52) U.S. Cl.
CPC ............ *G03F 7/0002* (2013.01); *C08L 63/04* (2013.01); *C09D 133/14* (2013.01); *C09D 133/16* (2013.01)

(58) Field of Classification Search
CPC ..... C08L 63/04; G03F 7/0002; B29C 59/026; C08D 133/16
See application file for complete search history.

(56) References Cited

U.S. PATENT DOCUMENTS

| | | | |
|---|---|---|---|
| 9,056,935 B2 | 6/2015 | Kim et al. | |
| 2007/0065757 A1 | 3/2007 | Ogino et al. | |
| 2009/0263631 A1 | 10/2009 | Sakamoto et al. | |
| 2013/0288021 A1 | 10/2013 | Hayashida et al. | |

FOREIGN PATENT DOCUMENTS

| | | |
|---|---|---|
| CN | 101595167 A | 12/2009 |
| CN | 101220224 B | 6/2010 |
| CN | 101984756 B | 2/2013 |
| JP | 62225552 A * | 10/1987 |
| JP | 2009-275194 A | 11/2009 |
| JP | 2010-135759 A | 6/2010 |
| TW | 538092 | 6/2003 |
| TW | 200921278 | 5/2009 |
| TW | 201135362 A1 | 10/2011 |
| TW | 201237556 A1 | 9/2012 |
| TW | 201336874 A1 | 9/2013 |
| TW | I529207 B | 4/2016 |
| WO | WO 98/49214 A1 | 11/1998 |

OTHER PUBLICATIONS

Taiwanese Office Action and Search Report dated Jun. 13, 2016, for Taiwanese Application No. 104142230.
Cheng et al.. "Room-Temperature, Low-Pressure Nanoimprinting Based on Cationic Photopolymerization of Novel Epoxysilicone Monomers", Advanced Materials, vol. 17, 2005, pp. 1419-1424.
Gokan et al., "Dry Etch Resistance of Organic Materials", J. Electrochem. Soc.: Solid-State Science and Technology, vol. 130, No. 1, Jan. 1983, pp. 143-146.
Iyoshi et al., "UV-Curabte Resins Appropriate for UV Nanoimprint", Journal of Photopolymer Science and Technology, vol. 21, No. 4, 2008, pp. 573-581.
Kunz et al., "Limits to Etch Resistance for 193-nm Single-Layer Resists", Proc. SPIE, Advances in Resist Technology and Processing XIII, vol. 2724, 1996. pp. 365-376.
Sakai et al., "Photo-curable Resins for UV Nanoinprint and their Evaluation Methods", Kobunshi Ronbunshu, vol. 66, Mar. 2009, pp. 88-96.
Sakai, "Photo-curable Resin for UV-Nanoimprint Technology", Journal of Photopolymer Science and Technology, vol. 22, No. 2, 2009, pp. 133-145.
Schuster et al., "mr-NIL 6000LT—Epoxywbased curing resist for combined thermal and UV nanoimprint lithography below 50° C", Microelectronic Engineering, vol. 86, 2009, pp. 722-725.

* cited by examiner

*Primary Examiner* — Sanza L. McClendon
(74) *Attorney, Agent, or Firm* — Birch, Stewart, Kolasch & Birch, LLP

(57) ABSTRACT

A photo-imprinting resin composition, a photo-imprinting resin film and a patterning process are provided. The photo-imprinting resin composition includes a novolac resin; a monomer having acrylic group, a polymer having acrylic group or a combination thereof; and a radical type photo-polymerization initiator. The novolac resin has a Mw of 500 to 50000. The novolac resin does not react with the monomer having acrylic group nor the polymer having acrylic group described above.

13 Claims, 2 Drawing Sheets

PHOTO-IMPRINTING RESIN COMPOSITION, PHOTO-IMPRINTING RESIN FILM AND PATTERNING PROCESS

CROSS-REFERENCE TO RELATED APPLICATION

This application claims the priority benefit of Taiwan application serial no. 104142230, filed on Dec. 16, 2015. The entirety of the above-mentioned patent application is hereby incorporated by reference herein and made a part of this specification.

TECHNICAL FIELD

The present disclosure relates to a photo-imprinting resin composition, a photo-imprinting resin film, and a patterning process.

BACKGROUND

With the rapid progress in integrated circuit (IC) technologies, device miniaturization and device integration are definitely on the rise and have become an important subject in various industries. A lithography and etching process plays an important role in an IC manufacturing process. In a traditional lithography and etching process, photolithography is a typical method which is performing exposure by a mask and development. That is, a photoresist is manufactured into an etching mask, and then an etching process is performed to transfer circuits or specific structures to the device. Nevertheless, a dimension and an aspect ratio of the structure are restricted to optical limits since the etching mask is manufactured by a photoresist lithography method. Thereby, bottlenecks may occur when forming a micro/nano structure having a high aspect ratio by an etching treatment. In addition, with the demand for manufacturing finer patterns, the price of the exposure apparatus used in the photolithography process is often very expensive.

A photo-imprinting process has an advantage such as rapid production compared to the traditional photolithography process. In addition, for the demand of enlargement of substrate size and pattern refinement of application devices, adjustment of the apparatus in the photo-imprinting process is much more flexible, so that it is expected to become a mainstream technology in the future. It should be noted that a photo-imprinting glue used in the photo-imprinting process is a critical material in the process. It may have a certain degree of influence on the quality of imprinting molding, reduction of imprinting residue layers, and yield rate of production.

SUMMARY

The present disclosure provides a photo-imprinting resin composition including a novolac resin; an acrylic material selected from the group consisting of a monomer having acrylic group, a polymer having acrylic group and the combination thereof; and a radical type photopolymerization initiator. The novolac resin has a weight average molecular weight (Mw) of 500 to 50000. The novolac resin does not react with the monomer having acrylic group nor the polymer having acrylic group.

The present disclosure provides a patterning process including the following steps. The photo-imprinting resin composition described above is coated on a substrate. An imprinting process is performed on the photo-imprinting resin composition by a mold to form a patterned photo-imprinting resin film. A curing treatment is performed on the patterned photo-imprinting resin film. The mold is removed. An etching treatment is performed on the substrate using the cured patterned photo-imprinting resin film as a mask.

The present disclosure provides a photo-imprinting resin film including the photo-imprinting resin composition described above.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1A:
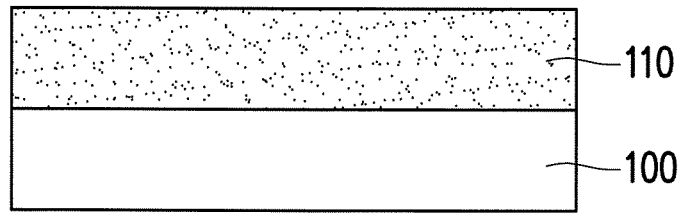
FIG. 1A to FIG. 1D are schematic cross-sectional views of a flow process of a patterning process according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A photo-imprinting resin composition of the embodiments of the present disclosure includes a novolac resin having a Mw of 500 to 50000; an acrylic material selected from the group consisting of a monomer having acrylic group, a polymer having acrylic group and the combination thereof; and a radical type photopolymerization initiator. Particularly, in the photo-imprinting resin composition of the embodiments of the present disclosure, the novolac resin does not react with the monomer having acrylic group nor the polymer having acrylic group. In the following, each component of the photo-imprinting resin composition of the embodiments of the present disclosure is illustrated respectively in detail.

In the photo-imprinting resin composition of the embodiments of the present disclosure, the novolac resin has a Mw of 500 to 50000. In one embodiment, the novolac resin includes at least a repeating unit represented by Formula 1:

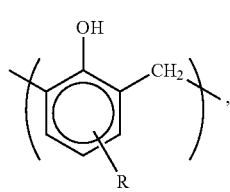

Formula 1 wherein R is a hydrogen atom or a methyl group. For example, the novolac resin of the embodiments of the present disclosure may include a structure represented by Formula 2:

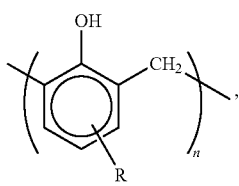

Formula 2 wherein R is a hydrogen atom or a methyl group, and n is an integer of 4 to 400.

In addition, the photo-imprinting resin composition of the embodiments of the present disclosure further includes an acrylic material selected from the group consisting of a monomer having acrylic group and a polymer having acrylic group. Specifically, the photo-imprinting resin composition of the embodiments of the present disclosure may include the monomer having acrylic group or the polymer having acrylic group, or may include the monomer having acrylic group and the polymer having acrylic group simultaneously.

The monomer having acrylic group may be a mono-functional group monomer, or a multi-functional group monomer. The mono-functional group monomer may include isobornyl acrylate, benzyl (meth)acrylate, phenethyl (meth)acrylate, phenoxyethyl (meth)acrylate, 1-naphthyl (meth)acrylate, 2-naphthyl (meth)acrylate, 1-naphthylmethyl (meth)acrylate, 2-naphthylmethyl (meth)acrylate, 1-naphthylethyl (meth)acrylate, 2-naphthylethyl (meth)acrylate, 1-naphthoxyethyl (meth)acrylate, 2-naphthoxyethyl (meth)acrylate. The multi-functional group monomer may include diethylene glycol monoethyl ether (meth)acrylate, dimethylol dicyclopentane di(meth)acrylate, di(meth)acrylated isocyanurate, 1,3-butanediol di(meth)acrylate, 1,4-butanediol di(meth)acrylate, 1,6-hexanediol diacrylate, 1,6-hexanediol di(meth)acrylate, allyloxy polyethylene glycol acrylate, 1,9-nonanediol di(meth)acrylate, bisphenol A di(meth)acrylate, modified bisphenol A di(meth)acrylate, bisphenol F di(meth)acrylate, hexahydrophthalic acid diacrylate, hydroxypivalic acid neopentyl glycol di(meth)acrylate, neopentyl glycol di(meth)acrylate, neopentyl glycol diacrylate, caprolactone-modified hydroxypivalyl hydroxypivalate, stearic acid-modified pentaerythritol di(meth)acrylate, phthalate di(meth)acrylate, poly(ethylene glycol-tetramethylene glycol) di(meth)acrylate, poly(propylene glycol-tetramethylene glycol) di(meth)acrylate, polyester diacrylate, polyethylene glycol di(meth)acrylate, polypropylene glycol di(meth)acrylate, propylene glycol di(meth)acrylate, silicone di(meth)acrylate, triethylene glycol di(meth)acrylate, tetraethylene glycol di(meth)acrylate, dimethylol tricyclodecane di(meth)acrylate, neopentyl glycol-modified trimethylolpropane di(meth)acrylate, tripropylene glycol diacrylate, tripropylene glycol di(meth)acrylate, triglycerol di(meth)acrylate, dipropylene glycol diacrylate, dipropylene glycol di(meth)acrylate, o-xylylene di(meth)acrylate, m-xylylene di(meth)acrylate, p-xylylene di(meth)acrylate, tricyclodecane dimethanol di(meth)acrylate, trimethylolpropane triacrylate, pentaerythritol triacrylate, and dipentaerythritol hexaacrylate. The monomers may be used alone or in a combination of at least two thereof.

The polymer having acrylic group may be selected from the group consisting of polyester acrylate, epoxy acrylate, polyether acrylate, polyurethane acrylate, and polyfluorene acrylate. The polymers may be used alone or in a combination of at least two thereof.

In the photo-imprinting resin composition of the embodiments of the present disclosure, the acrylic material may be present in an amount of 10 to 1000 parts by weight based on 100 parts by weight of the novolac resin. Particularly, both the monomer having acrylic group and the polymer having acrylic group do not react with the novolac resin. That is, the monomer having acrylic group and/or the polymer having acrylic group and the novolac resin exist individually and stably in a mixture form in the photo-imprinting resin composition of the embodiments of the present disclosure.

In addition, the photo-imprinting resin composition of the embodiments of the present disclosure also includes the radical type photopolymerization initiator. In one embodiment, the radical type photopolymerization initiator may be present in an amount of 1 to 80 parts by weight based on 100 parts by weight of the novolac resin. The radical type photopolymerization initiator may be selected from the group consisting of an acetophenone-based compound, an acylphosphine oxide-based compound, and an oxime ester-based compound, for example. The radical type photopolymerization initiators may be used alone or in a combination of at least two thereof.

Examples of the acetophenone-based compound may be hydroxyl acetophenone-based compounds, dialkoxy acetopheneon-based compounds, and amino acetopheneon-based compounds. The hydroxyl acetophenone-based compounds may be commercial products such as Irgacure 2959 (1-[4-(2-hydroxyethoxy)phenyl]-2-hydroxy-2-methyl-1-propan-1-one), Irgacure 184 (1-hydroxycyclohexylphenyl ketone), Irgacure 500 (1-hydroxycyclohexylphenyl ketone/benzophenone), or Darocur 1173 (2-hydroxy-2-methyl-1-phenyl-1-propan-1-one) made by the Ciba Company. The dialkoxy acetopheneon-based compounds may be commercial products such as Irgacure 651 (2,2-dimethoxy-1,2-diphenylethane-1-one) made by the Ciba Company. The amino acetopheneon-based compounds may be commercial products such as Irgacure 369 (2-benzyl-2-dimethylamino-1-(4-morpholinylphenyl)-1-butanone), or Irgacure 907 (2-methyl-1-[4-methylthiophenyl]-2-morpholinyl-propan-1-one) made by the Ciba Company.

Examples of the acylphosphine oxide-based compound may be commercial products including Irgacure 819 (bis(2,4,6-trimethylbenzoyl)-phenyl phosphine oxide), or Irgacure 1800 (bis(2,6-dimethoxybenzoyl)-2,4,4-trimethyl-pentyl phosphine oxide) made by the Ciba Company, and commercial products including Lucirin TPO (2,4,6-trimethylbenzoyldiphenyl phosphine oxide), or Lucirin TPO-L (2,4,6-trimethylbenzoylphenylethoxy phosphine oxide) made by the BASF Company.

Examples of the oxime ester-based compound may be commercial products including Irgacure OXE01 (1,2-octanedione-1-[4-(phenylthio)phenyl]-2-(O-benzoyl oxime)), and Irgacure OXE02 (ethanone-1-[9-ethyl-6-(2-methylbenzoyl)-9H-carbazol-3-yl]-1-(O-acetyl oxime)) made by the BASF Company.

The photo-imprinting resin composition of the embodiments of the present disclosure may selectively include a solvent, so that the novolac resin, the monomer and/or the polymer having acrylic group, and the radical type photopolymerization initiator may be uniformly dissolved and dispersed. The solvent may be selected from the group consisting of propylene glycol monomethyl ether acetate, propylene glycol methyl ether, anisole, and propylene carbonate. The solvents may be used alone or a combination of at least two thereof. In the photo-imprinting resin composition of the embodiments of the present disclosure, the solvent is present in an amount of 50 to 5000 parts by weight.

The photo-imprinting resin composition of the embodiments of the present disclosure may selectively include an additive. The additive may be a photoacid generator, a surfactant, a photosensitizer, or a combination thereof.

A patterning process using the photo-imprinting resin composition of the present disclosure is illustrated in the following description.

FIG. 1A to FIG. 1D are schematic cross-sectional views of a flow process of a patterning process according to an embodiment of the present disclosure. First, referring to FIG. 1A, the photo-imprinting resin composition of the embodiments of the present disclosure is coated on a substrate 100 so as to form a photo-imprinting resin composition coating layer 110. The substrate 100 is a semiconductor substrate, a metal oxide semiconductor substrate, a metal substrate, or a substrate with a specific component layer, for example. A method of coating the photo-imprinting resin composition is a spin coating method, a dip coating method, a wire bar coating method, a gravure coating method, or a slot coating method, for example. In addition, when the photo-imprinting resin composition includes the solvent, a baking treatment may be performed to remove the solvent in the photo-imprinting resin composition. The baking treatment is a thermal convection method, an infrared light irradiation method, or a thermal conduction method, for example. A temperature of the baking treatment is from 50° C. to 150° C.

Figure 1B:
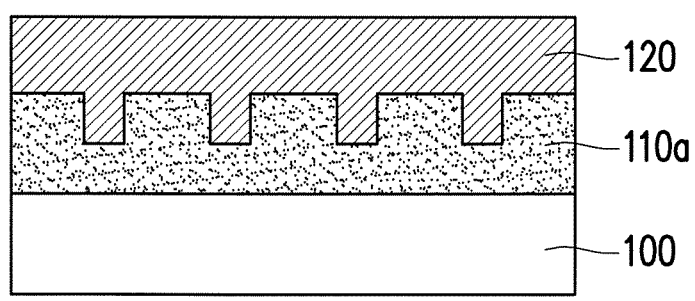

Next, referring to FIG. 1B, an imprinting process is performed on the photo-imprinting resin composition coating layer 110 by an imprinting mold 120 to form a patterned photo-imprinting resin film 110a. The imprinting mold 120 has the required imprinting pattern, such as a wire pattern or a specific component pattern. A material of the imprinting mold 120 is polydimethylsiloxane (PDMS), cyclic olefin polymer, polycarbonate, polymethacrylate, other polymer material, silica glass, ceramic materials, metal or a composite material composed of polymer and silicon oxide, aluminum oxide, titanium oxide or zirconium oxide. In order to improve release property between the photo-imprinting resin composition and the surfaces of the mold, a silicon-based silane coupling agent or a fluorine-based silane coupling agent may be selectively used to perform a surface treatment on the mold. In addition, the imprinting process is a room-temperature imprinting process or a temperature rise imprinting process, for example.

Figure 1C:
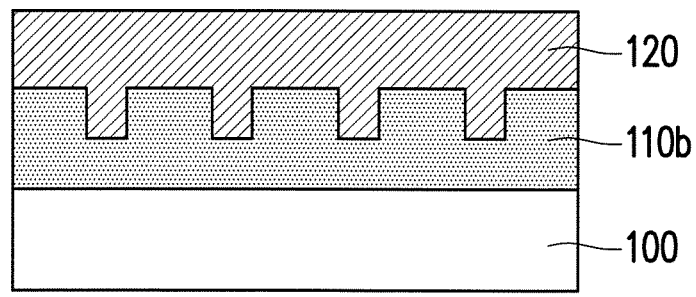
Figure 1D:
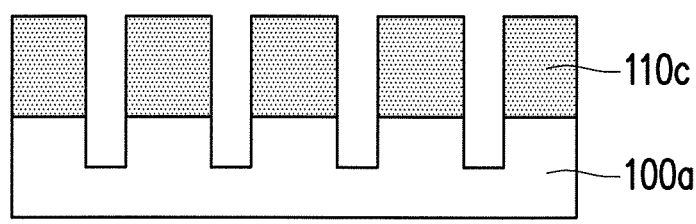

Next, referring to FIG. 1C, a curing treatment is performed on the patterned photo-imprinting resin film 110a so as to cure the patterned photo-imprinting resin film 110a to form the cured patterned photo-imprinting resin film 110b. In the embodiments, the curing treatment is an irradiation curing treatment, for example. The light source used in the irradiation curing treatment is, such as an ultraviolet fluorescent lamp, a low-pressure mercury lamp, a high-pressure mercury lamp, a ultra-high pressure mercury lamp, a xenon lamp, a carbon arc lamp, a LED lamp, and the like, not particularly limited thereto. After that, referring to FIG. 1D, the imprinting mold 120 is removed. Then, the cured patterned photo-imprinting resin film 110b is used as an etching mask, and an etching treatment is performed on the substrate 100 to remove parts of the substrate so as to form a patterned substrate 100a. Then, a patterned cured photo-imprinting resin thin film 110c is removed. Particularly, in the process of the etching treatment, parts of the cured patterned photo-imprinting resin film 110b is removed simultaneously to form the patterned photo-imprinting resin film 110c. The etching treatment is an anisotropic etching treatment, for example.

EXAMPLES

The present disclosure is described more concretely with reference to embodiments given below. In the following examples, the material used, its amount and the ratio, the details of the treatment and the treatment process may be suitably modified or changed not overstepping the scope of the present disclosure. Accordingly, the present disclosure should not be limitatively interpreted by the examples mentioned below.

Preparation of Acrylic-type Photo-imprinting Resins (Comparative Example 1 to Comparative Example 3)

TABLE 1

| Composition | | Comparative Example 1 | Comparative Example 2 | Comparative Example 3 |
|---|---|---|---|---|
| Acrylic resin | PET 100 | 10 | | |
| | M 7400 | | 10.2 | |
| | EA-0200 | | | 3 |
| Acrylic monomer | TPGDA | 9 | 10.2 | |
| Photoreaction initiator | Irgcure-819 | 0.45 | 0.5 | 0.12 |
| Sensitizer | ITX | | | 0.06 |
| Solvent | PGMEA | 6.6 | 6.6 | 7 |

The compositions of the above table are illustrated below. PET100 is a polyurethane acrylate resin. M7400 is an epoxy acrylate resin. EA-0200 is polyfluorene acrylate. TPGDA is tripropylene glycol diacrylate. Irgacure 819 is a commercial product of a photoreaction initiator made by the Ciba Company. ITX is isopropyl thioxanthone. A ratio of each component is represented by weight ratio. A preparation method of each comparative example is that the acrylic resin, the acrylic monomer, the photoreaction initiator, and the sensitizer as shown in the table are added into the solvent, propylene glycol monomethyl ether acetate, and filtered by a 0.1 μm filter made of polytetrafluoroethylene after mixing well, so that the preparation of the comparative examples is completed.

Preparation of Novolac Resin Solutions (Comparative Example 4 to Comparative Example 6)

TABLE 2

| Composition | Comparative Example 4 | Comparative Example 5 | Comparative Example 6 |
|---|---|---|---|
| Novolac resin A | 3.8 | | |
| Novolac resin B | | 3.5 | |
| Novolac resin C | | | 2.9 |
| Propylene glycol monomethyl ether acetate | 6.2 | 6.5 | 7.1 |

The compositions of the above table are illustrated below. The novolac resin A, the novolac resin B, the novolac resin C are all cresol novolac resins derived from the polymerization of formaldehyde with dimethyl phenol and methyl phenol. Mw of novolac resin A, the novolac resin B and the novolac resin C are about 3400, 2500, and 2000, respectively. Polydispersity index (PDI) of novolac resin A, the novolac resin B and the novolac resin C are about 2.69, 1.60, and 1.46, respectively. A ratio of each component is represented by weight ratio. A preparation method of each comparative example is that the novolac resin is added into the solvent, propylene glycol monomethyl ether acetate, and filtered by a 0.1 μm filter made of polytetrafluoroethylene after mixing well, so that the preparation of the comparative examples is completed.

Preparation of Photo-imprinting Resins Including the Novolac Resins, the Monomer having Acrylic Group, and the Polymer having Acrylic Group (Embodiment 1 to Embodiment 6)

TABLE 3

| Composition | Example 1 | Example 2 | Example 3 | Example 4 | Example 5 | Example 6 |
|---|---|---|---|---|---|---|
| Comparative Example 1 | 6 | 5 | 6 | 6 | | |
| Comparative Example 2 | | | | | 6 | |
| Comparative Example 3 | | | | | | 6 |
| Comparative Example 4 | 2 | 2 | 3 | | 3 | |
| Comparative Example 5 | | | | | | 3 |
| Comparative Example 6 | | | | 4 | | |

The photo-imprinting resins of Example 1 to Example 6 are combinations of the acrylic-type photo-imprinting resins of Comparative Example 1 to Comparative Example 3 and the novolac resin solutions of Comparative Example 4 to Comparative Example 6 following the above table. A ratio of each component is represented by weight ratio. A preparation method of Example 1 to Example 6 is that the acrylic-type photo-imprinting resin and the novolac resin solution are mixed well, and then filtered by a 0.1 μm filter made of polytetrafluoroethylene, so the preparation of the embodiments is completed.

Comparison of the Photo-imprinting Characteristics Test

In comparison of the imprinting characteristics, the imprinting resins of the comparative examples and examples are spin-coated on a 2-inch sapphire wafer by a spin coating method at speed of 3000 rpm. The coating film is pre-baked by a heating plate at 120° C. for 120 seconds to remove the solvent in the composition. The imprinting test is performed by a polydimethylsiloxane mold having a circular cave pattern, wherein a diameter of the circular cave is 2 μm and a depth thereof is 3.5±0.5 μm. The room-temperature imprinting process is used in Comparative Example 1 to Comparative Example 3, wherein the imprinting pressure is 0.5 Kgf/cm$^2$, the imprinting time is 120 seconds, and UV energy of 600 mJ/cm$^2$ is used for irradiation curing with a 365 nm LED. The temperature rise imprinting process is used in Comparative Example 4 to Comparative Example 6 and Example 1 to Example 6, wherein the imprinting temperature is 80° C., the imprinting pressure is 2 Kgf/cm$^2$, the imprinting time is 180 seconds, and UV energy of 600 mJ/cm$^2$ is used for irradiation curing with a 365 nm LED. Test results are shown in Table 4.

TABLE 4

| | Height of pillar pattern (nm) | Sticking contamination on mold |
|---|---|---|
| Comparative Example 1 | 3652 | None |
| Comparative Example 2 | 2875 | None |
| Comparative Example 3 | 830 | None |
| Comparative Example 4 | — | Partially contaminated |
| Comparative Example 5 | — | Partially contaminated |
| Comparative Example 6 | — | Partially contaminated |
| Example 1 | 3789 | None |
| Example 2 | 3631 | None |
| Example 3 | 3830 | None |
| Example 4 | 3789 | None |
| Example 5 | 3625 | None |
| Example 6 | 574 | None |

Assessment of the imprinting characteristics is that the imprinting test piece is cut into fragments, and then a height of the pillar pattern is observed and measured by an electron microscope to assess the replication quality of imprinting. In Comparative Example 4 to Comparative Example 6, since the poor imprinting quality, the replicated pattern is very shallow. Thus, a height of the pillar pattern is unable to measure. In addition, there is a phenomenon of partial resin contamination on the mold after demolding. However, comparing Example 1 to Example 4 with Comparative Example 1 without adding the novolac resin respectively, comparing Example 5 with Comparative Example 2 without adding the novolac resin respectively, and comparing Example 6 with Comparative Example 3 without adding the novolac resin respectively, the results indicate that Example 1 to Example 6 have a good replication quality of imprinting without the phenomenon of sticking contamination.

Dry Etching Resistance Test of the Photo-imprinting Resin Films

A half of the imprinting test pieces of Comparative Example 1 to Comparative Example 3 and Example 1 to Example 6 is covered by a sapphire wafer to protect the imprinting structure thereof was not subject to erosion and bombardment of the etching gas in the etching process. Then, an etching process was performed on the photo-imprinting resin films by a 50 W oxygen plasma for 3 minutes. The wafer covered thereon is removed after completion. Then, a cross-sectional analysis of the test pieces is performed by an electron microscope to measure the height of the imprinting pillar structure of the region covered by the wafer and the height of the pillar structure of the region without covering by the wafer. The height of the pillar structure of the region covered by the wafer minus the height of the pillar structure of the region without covering by the wafer, and then divided by the etching time to obtain an etching rate of the imprinting glue. The results of the etching rate measured from each example are shown in Table 5 below.

TABLE 5

| Photo-imprinting gel | Imprinting pillar height (nm) | Pillar height after oxygen plasma etching (nm) | Etching rate (nm/min) |
|---|---|---|---|
| Comparative Example 1 | 3652 | 3250 | 134 |
| Comparative Example 2 | 2875 | 2375 | 167 |
| Comparative Example 3 | 830 | 681 | 50 |
| Example 1 | 3789 | 3615 | 58 |
| Example 2 | 3631 | 3473 | 53 |

TABLE 5-continued

| Photo-imprinting gel | Imprinting pillar height (nm) | Pillar height after oxygen plasma etching (nm) | Etching rate (nm/min) |
| --- | --- | --- | --- |
| Example 3 | 3830 | 3625 | 68 |
| Example 4 | 3789 | 3538 | 84 |
| Example 5 | 3625 | 3312 | 104 |
| Example 6 | 574 | 447 | 42 |

According to the test results as shown in the above table, comparing Comparative Example 1 with Example 1 to Example 4, comparing Comparative Example 2 with Example 5, and comparing Comparative Example 3 with Example 6, the photo-imprinting resin films (Example 1 to Example 6, the photo-imprinting resin composition of the present disclosure) formed from the photo-imprinting resin composition including the novolac resin and the monomer/polymer having acrylic group simultaneously have a lower etching rate in the etching process compared to the photo-imprinting resin film (Comparative Example 1 to Comparative Example 3) formed from the photo-imprinting resin composition without the novolac resin. That is, the photo-imprinting resin film of the present disclosure has a better etching resistance.

Although the present disclosure has been described with reference to the above embodiments, it is apparent to one of the ordinary skill in the art that modifications to the described embodiments may be made without departing from the spirit of the present disclosure. Accordingly, the scope of the present disclosure will be defined by the attached claims not by the above detailed descriptions.

The invention claimed is:

1. A photo-imprinting resin composition, comprising:
a novolac resin having a weight average molecular weight of 500 to 50000;
an acrylic material comprising a polymer having acrylic group; and
a radical type photopolymerization initiator,
wherein the novolac resin does not react with the polymer having acrylic group,
wherein the polymer having acrylic group is selected from the group consisting of polyester acrylate, epoxy acrylate, polyether acrylate, polyurethane acrylate, polyfluorene acrylate, and a combination thereof, and
wherein the novolac resin comprises at least a repeating unit represented by Formula 1:

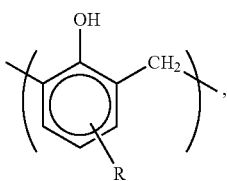

Formula 1 wherein R is a hydrogen atom or a methyl group.

2. The photo-imprinting resin composition according to claim 1, wherein the novolac resin comprises a structure represented by Formula 2:

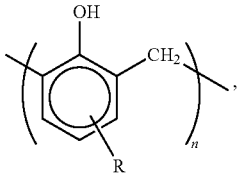

Formula 2 wherein R is a hydrogen atom or a methyl group, and n is an integer of 4 to 400.

3. The photo-imprinting resin composition according to claim 1, wherein the acrylic material is present in an amount of 10 to 1000 parts by weight based on 100 parts by weight of the novolac resin.

4. The photo-imprinting resin composition according to claim 1, wherein the radical type photopolymerization initiator is present in an amount of 1 to 80 parts by weight based on 100 parts by weight of the novolac resin.

5. The photo-imprinting resin composition according to claim 1, wherein the radical type photopolymerization initiator is selected from the group consisting of a acetophenone-based compound, a acylphosphine oxide-based compound, an oxime ester-based compound, and a combination thereof.

6. The photo-imprinting resin composition according to claim 1, wherein the acrylic material further comprises a monomer having acrylic group that is selected from the group consisting of isobornyl acrylate, benzyl (meth)acrylate, phenethyl (meth)acrylate, phenoxyethyl (meth)acrylate, 1-naphthyl (meth)acrylate or 2-naphthyl (meth)acrylate, 1-naphthylmethyl (meth)acrylate or 2-naphthylmethyl (meth)acrylate, 1-naphthylethyl (meth)acrylate or 2-naphthylethyl (meth)acrylate, 1-naphthoxyethyl (meth)acrylate or 2-naphthoxyethyl (meth)acrylate, diethylene glycol monoethyl ether (meth)acrylate, dimethylol dicyclopentane di(meth)acrylate, di(meth)acrylated isocyanurate, 1,3-butanediol di(meth)acrylate, 1,4-butanediol di(meth)acrylate, 1,6-hexanediol diacrylate, 1,6-hexanediol di(meth)acrylate, allyloxy polyethylene glycol acrylate, 1,9-nonanediol di(meth)acrylate, bisphenol A di(meth)acrylate, modified bisphenol A di(meth)acrylate, bisphenol F di(meth)acrylate, hexahydrophthalic acid diacrylate, hydroxypivalic acid neopentyl glycol di(meth)acrylate, neopentyl glycol di(meth)acrylate, neopentyl glycol diacrylate, caprolactone-modified hydroxypivalyl hydroxypivalate, stearic acid-modified pentaerythritol di(meth)acrylate, phthalate di(meth)acrylate, poly(ethylene glycol-tetramethylene glycol) di(meth)acrylate, poly(propylene glycol-tetramethylene glycol) di(meth)acrylate, polyester diacrylate, polyethylene glycol di(meth)acrylate, polypropylene glycol di(meth)acrylate, propylene glycol di(meth)acrylate, silicone di(meth)acrylate, triethylene glycol di(meth)acrylate, tetraethylene glycol di(meth)acrylate, dimethylol tricyclodecane di(meth)acrylate, neopentyl glycol-modified trimethylolpropane di(meth)acrylate, tripropylene glycol diacrylate, tripropylene glycol di(meth)acrylate, tri glycerol di(meth)acrylate, dipropylene glycol diacrylate, dipropylene glycol di(meth)acrylate, o-xylylene di(meth)acrylate, m-xylylene di(meth)acrylate, p-xylylene di(meth)acrylate, tricyclodecane dimethanol di(meth)acrylate, trimethylolpropane triacrylate, pentaerythritol triacrylate, dipentaerythritol hexaacrylate, and a combination thereof,
wherein the novolac resin does not react with the monomer having acrylic group.

7. The photo-imprinting resin composition according to claim 1, further comprising a solvent.

8. The photo-imprinting resin composition according to claim 7, wherein the solvent is present in an amount of 50 to 5000 parts by weight based on 100 parts by weight of the novolac resin.

9. The photo-imprinting resin composition according to claim 7, wherein the solvent is selected from the group consisting of propylene glycol monomethyl ether acetate, propylene glycol methyl ether, anisole, propylene carbonate, or a combination thereof.

10. A patterning process, comprising:
    coating the photo-imprinting resin composition according to claim 1 on a substrate;
    performing an imprinting process on the photo-imprinting resin composition by a mold to form a patterned photo-imprinting resin film;
    performing a curing treatment on the patterned photo-imprinting resin film;
    removing the mold; and
    performing an etching treatment on the substrate using the cured patterned photo-imprinting resin film as a mask.

11. The patterning process according to claim 10, wherein the imprinting process comprises a room-temperature imprinting process or a temperature rise imprinting process.

12. The patterning process according to claim 10, wherein the curing treatment comprises an irradiation curing treatment.

13. A photo-imprinting resin film, comprising the photo-imprinting resin composition according to claim 1.

* * * * *